United States Patent [19]

Sakurai et al.

[11] Patent Number: 4,516,222

[45] Date of Patent: May 7, 1985

[54] LAMINATED MAGNETIC BUBBLE DEVICE

[75] Inventors: Yoshifumi Sakurai, Osaka; Takuhisa Numata, Hyogo, both of Japan

[73] Assignee: Kureha Kagaku Kogyo Kabushiki Kaisha, Tokyo, Japan

[21] Appl. No.: 435,097

[22] Filed: Oct. 18, 1982

[30] Foreign Application Priority Data

Oct. 19, 1981 [JP] Japan ............... 56-166722

[51] Int. Cl.³ ............................................. G11C 19/08
[52] U.S. Cl. ...................................... 365/32; 365/29; 365/36; 365/41
[58] Field of Search ................. 365/31, 32, 33, 41, 365/36, 29

[56] References Cited

U.S. PATENT DOCUMENTS 4,070,658 1/1978 Giess et al. ............................ 365/32
4,095,279 6/1978 Lins ....................................... 365/32
4,122,538 10/1978 Lins .

OTHER PUBLICATIONS

"Multilayer Epitaxial Garnet Films for Magnetic Bubble Devices-Hard Bubble Suppression", A. H. Bobeck et al, The Bell System Technical Journal, vol. 51, No. 6, Jul.-Aug., 1972.
"Internal Bias Effect of Double Layer Epitaxial Garnet Films", Uchishiba et al, IEEE Transactions on Magnetics, vol. MAG-9, No. 3, Sep., 1973.
"Wall State Stability of Bubbles in Uniaxial Double-Layer LPE Films", Menz et al, IEEE Transactions on Magnetics, vol. MAG-14, No. 5, Sep., 1978.
"Dynamic Behavior of Domain Walls in Double Layer Self-Biasing Bubble Garnet Films", Zebrowski et al, IEEE Transactions on Magnetics, vol. MAG-15, No. 6, Nov., 1979.

*Primary Examiner*—James W. Moffitt
*Attorney, Agent, or Firm*—Woodcock Washburn Kurtz Mackiewicz & Norris

[57] ABSTRACT

Herein disclosed is a laminated magnetic bubble device of a multiple layer structure composed of at least one thin magnetic film having low coercive force and vertically oriented anisotropy which can allow easy generation and erasure of a magnetic bubble, and at least one thin magnetic film having high coercive force and vertically oriented anisotropy which will not be affected by a magnetic field of low level used for generating the magnetic bubble in the thin film of low coercive force.

15 Claims, 10 Drawing Figures

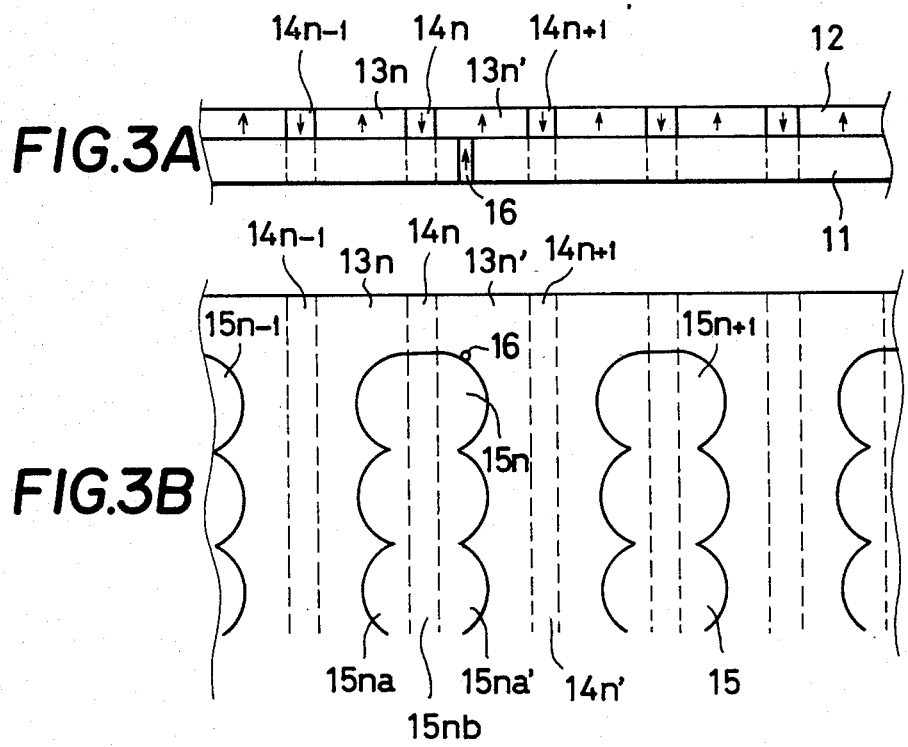

LAMINATED MAGNETIC BUBBLE DEVICE

BACKGROUND OF THE INVENTION

1. Field of the Invention

This invention relates to a magnetic bubble device, and more particularly to a laminated magnetic bubble device of a multiple layer structure composed of at least two thin magnetic films such as, for example, a thin magnetic film having vertically oriented anisotropy and low coercive force which allows easy generation and erasure of magnetic bubbles and a thin magnetic film having vertically oriented anisotropy and high coercive force which is not affected by a magnetic field of low level used for generating the magnetic bubbles in the magnetic film of low coercive force. The bubble device can be adapted to a magnetic bubble memory or a magneto-optical element.

2. Description of the Prior Art

A conventional magnetic bubble element is, in general, constructed by laminating a magnetic thin film having vertically oriented anisotropy and low coercive force of less than 1 Oe on a substrate of GGG (gadolinium-gallium-garnet) or the like, for example, and then forming thereon a pattern of permalloy, ion-implanted garnet film or the like. As well known in the art, since a magnetic bubble can be easily propagated within such a pattern, it can be used as a magnetic bubble memory. The details of the magnetic bubble element are described in a literature by the inventor, of this invention, et al, entitled "MAGNETIC BUBBLE ELEMENTS" and presented on the Denki Gakkai Shi, Vol. 100, No. 3, Pages 215-218.

For a pattern for propagating a magnetic bubble, high information density as well as high operation speed are important requisites. At present, a major-minor system such a contiguous disc type as shown in FIG. 1, for example, is widely utilized. Since the ion-implanted garnet has such disadvantages that the direction of pattern formation is limited becase of crystal anisotropy due to ion implantation and others, it is most preferable to form a high density of contiguous disc by use of a permalloy. However, in the case of the permalloy pattern, if the density of a disc 2 within a minor loop 1 becomes high, there arises such a tendency that a bubble 3 moving within the disc jumps to an adjacent disc, or the bubble is erroneously propagated within the same disc from one side to the other side thereof, resulting in miss-information. These phenomena may result in an error of information. In FIG. 1, reference numeral 4 shows a major loop, 5 shows a transfer line and 6 shows a write-in line.

SUMMARY OF THE INVENTION

It is therefore an object of the present invention to provide a magnetic bubble element capable of avoiding erroneous transferring of a bubble by forming within the magnetic film a magnetic domain which is stable and not varied so easily by a magnetic field for generating the bubble or a bias field, etc. applied upon the generation, erasure or transferring of the bubble, and combining the magnetic domain and transferring patterns so as to limit the range of movement of the bubble within the same magnetic domain.

The laminated magnetic bubble device in accordance with the present invetnion is constructed by laminating at least one thin magnetic film having vertically orented anisotropy and high coercive force (hereinafter referred to as hard film) on or under at least one thin magnetic film of having vertically oriented anisotropy and low coercive force (hereinafter referred to as soft film) in which bubbles can be readily generated or erased, and forming within the plane of the hard film a plurality of magnetic domains whose directions of magnetization are different from each other with their respective adjoining domains.

In the present invention, $(YBi)_3(FeGa)_5O_{12}$, for example, can be used as material for the thin mangetic film of low coercive force, namely, soft film, and the coercive force of which generally lies in the range of approximately 0-1 Oe. On the contrary, as a typical material for the hard film, $(BiGdSmLu)_3(FeAl)_5O_{12}$ can be used, and the coercive force of which must be in general over approximately 80 Oe, and preferably in the range of approximately 100-3000 Oe since it is required to be higher than the bias field applied thereto. A two-layer garnet film consisting of such soft and hard films as mentioned above can be formed on a substrate such as GGG through a liquid phase epitaxial method (LPE method), and the thickness of each soft and hard film is usually less than approximately 100 $\mu$m and preferably in the range of approximately 0.01-10 $\mu$m.

BRIEF DESCRIPTION OF THE DRAWINGS

The novel features of the subject invention, as well as the invention itself, and the objects and advantages thereof will be better understood from the following description taken in conjunction with the accompanying drawings in which:

FIG. 2 shows a schematic illustration useful for explaining the magnetization for magnetic films in a laminated magnetic bubble advice in accordance with the present invention, in which

FIG. 3 shows a schematic illustration useful for explaining the principles of a magnetic bubble memory using the laminated magnetic bubble device in accordance with the present invention, and in particular, FIG. 3A shows a sectional view of a portion of the magnetic film and FIG. 3B show a plan view of a pattern formed on the laminated magnetic film;

DESCRIPTION OF THE PREFERRED EMBODIMENT

Figure 1:
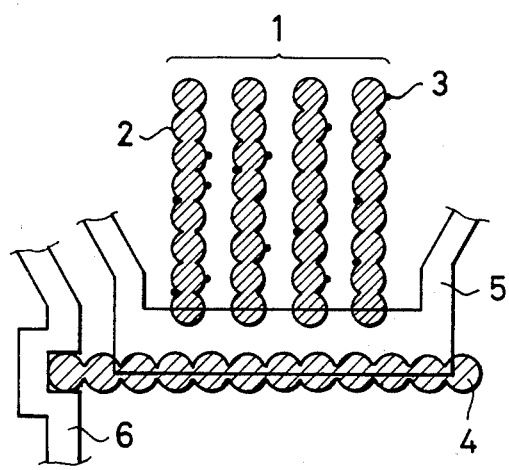
FIG. 1 shows a diagrammatical illustration useful for explaining the principles of a contiguous disc circuit.

Referring now to the drawings, and more particularly to FIGS. 2 to 7 thereof, the laminated magnetic bubble device of the present invention is therein illustrated in connection with the preferred embodiment thereof.

Figure 2A:
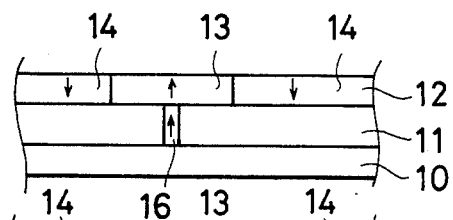
FIG. 2A is a sectional view and FIG. 2B is a plan view.
Figure 2B:
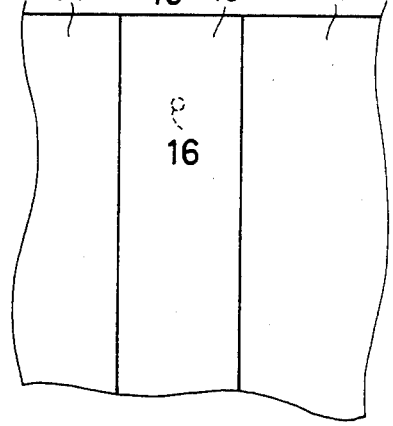

In FIGS. 2A and 2B, the laminated magnetic bubble device of this invention is shown as having a two-layer garnet film comprising a soft film 11 with a coercive force of less than approximately 1 Oe and a hard film 12 with a coercive force of more than approximately 80

Oe, in such a manner that the former is formed adjacent to a substrate 10 such as GGG using the LPE method. Alternatively, it will be possible to form the hard film 12 on the substrate 10, and then form the soft film 11 on the hard film 12. In addition, it may also be possible to construct the magnetic film in the form of a multiple layer structure comprising a plurality of hard and/or soft films, or in the form of a structure having a plurality of two-layer structures each comprising the soft film and the hard film or having a plurality of multiple layer structures. The hard film 12 is formed, for example, with domains 13 magnetized upward and domains 14 located at the both sides thereof and magnetized downward. Assuming now that an upwardly magnetized bubble 16 is formed in a portion of the soft film 11 facing the domain 13, the bubble 16 will not be transferred outside the domain 13 since it will be influenced by the strong magnetic fields from the domains 13 and 14.

FIGS. 3A and 3B show an example wherein a pattern is further formed on the hard film of FIG. 2. For the sake of simplicity, in FIG. 3A, only the hard film and the soft film are shown in section, and in FIG. 3B, only part of the transferring disc pattern on the bubble film is shown as a plan view. However, in reality, it is generally so constructed that a spacer, control conductors, and a transferring permalloy pattern, for example, are laminated in this order on the bubble film as is similar to the conventional magnetic bubble memory. As shown in FIG. 3B, each disc 15 of contiguous disc circuit pattern is divided into three parts 15na, 15na' and 15nb by magnetic fields from two upward domains 13n and 13n' and a downward domain 14n formed within the hard film 12 in such that the domain 14n is sandwiched between the domains 13n and 13n'. Thus, the upward domains 13n and 13n' are separated from each other by the downward domain 14n on one hand and also separated by the down ward domains $14_{n-1}$ and $14_{n+1}$, respectively, from the upward domains on discs $15_{n-1}$ and $15_{n+1}$ located adjacent to the disc 15n on the other hand.

In the case where the bubble 16 is formed at a point of the soft film 11 as shown in FIG. 2B and moved on the disc 15na', it will be understood that the jumping of the bubble to the adjoining disc $15_{n+1}$ may be prevented by the downward magnetic field of the domain $14_{n+1}$ and the propagation thereof to other portions 15nb and 15na is also prevented by the presence of the domain 14n.

In the arrangements shown in FIGS. 2 and 3, it is presupposed that the bubble can be established within the soft film which is placed under the influence of a certain magnetic field from the plurality of domains formed in the hard film, but this assumption has been confirmed by the inventors as indicated in the example. Since it is a well known fact, in view of the conventional bubble memory, that the bubble can be propagated through the pattern biased with a constant magnetic field, it can be readily understood that such a bubble memory as shown in FIG. 3 can operate properly.

In the illustrated arrangement, the formation of a plurality of domains in the hard film can be accomplished by maintaining the direction of magnetization thereto in uniform as the first step and then irradiating a laser beam thereto. As the result, the direction of magnetization is reversed only in the irradiated portions to form a plurality of domains. Since it can also be divided into a domain of extremely fine strip or stripe, a high density of bubble memory can be readily obtained. The width of the domain may be different from each other.

It will be understood that the laminated magnetic bubble element of this invention is not limited to the embodiment of the magnetic film of laminated structure as shown in FIG. 3 which is used in the combination with the permalloy pattern, many modifications may be made by those skilled in the art. For example, the closure of the transferring pattern circuit may be made by first forming on a substrate a laminated film consisting of a hard film and a soft film for which the direction of magnetization is uniform, then forming thereon a pattern of optional constitution, for example such as ion implanted layer, and thereafter causing the magnetization in the hard film portion corresponding to a part of the transfering pattern to be reversed. The laminated magnetic bubble element having such a pattern circuit as modifed above can be utilized as a bubble memory or a circuit for automation equipment. As illustrated in the example below, such a transmission factor of polarized light can be partially changed by the intensity of magnetic field, a photoswitch may be realized by utilizing that portion.

EXAMPLE

Figure 4:
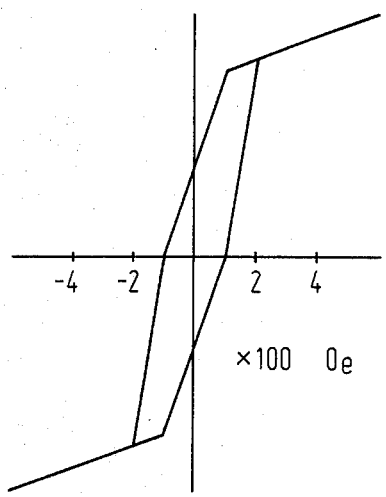
FIG. 4 is a graph showing a magnetization curve for the magnetic film.

Two layers, namely, one of which is a soft-film layer of $(YBi)_3(FeGa)_5O_{12}$ having a thickness of 10 μm and a low coercive force and the other is a hard-film layer of $(BiGdSmLu)_3(FeAl)_5O_{12}$ having a thickness of 7 μm and a high coercive force were laminated on the GGG substrate having a thickness of 400 μm by use of a liquid phase epitaxial method in such a manner that the hard film is an outer layer. In this case, it shows that the saturation magnetization $4\pi Ms$ of the soft film is 230 gausses, the coercive force thereof is less than 1 Oe and its characteristic length is 0.41 μm, whereas the saturation magnetization $4\pi Ms$ of the hard film is 210 gausses and the coercive force thereof is 140 Oe. The magnetization curves of this laminated layer are shown in FIG. 4 as the results of measurement by means of a sample vibration type magnetometer.

Figure 5A:
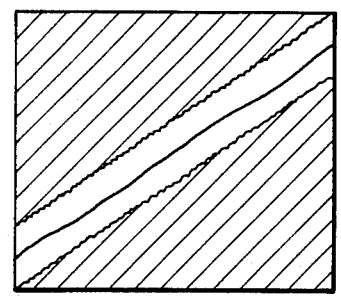
FIG. 5A shows a replica from a photograph on Faraday effect for the magnetic film.
Figure 5B:
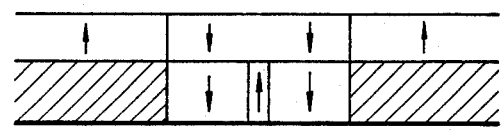
FIG. 5B shows a sectional view of FIG. 5A.

The hard film in this laminated layer was first magnetized in the upward direction, and then partially reversed in its polarity by irradiation of a laser beam to form an inversion domain having a width of 50 μm, and at the same time, an inversion domain was also formed in the soft film located within the inversion domain of the hard film. In FIG. 5A, a polarizing microscope photograph for this laminated layer taken by utilization of the magnetic Faraday effect is illustrated, and it was ascertained that it has the direction of magnetization as shown in FIG. 5B. In FIGS. 5A and 5B, the hatched portions show snake-like stripe domains.

Figure 6:
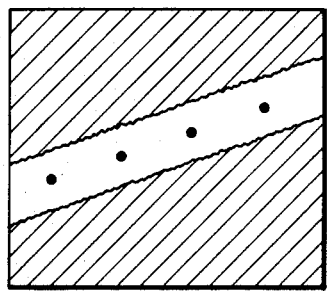
FIG. 6 shows a similar view to FIG. 5A.

Next, the magnetic field H was applied to the laminated layer. As the result of observation by means of the polarizing microscope while raising the magnetic field gradually, it was found that the central stripe seen in FIG. 5A is broken off when the strength of magnetic field exceeds approximately 70 Oe, and then transformed into bubbles as shown in FIG. 6 (photograph in the case of H=80 Oe) and finally disappeared due to collapse as the magnetic field is further raised.

Figure 7:
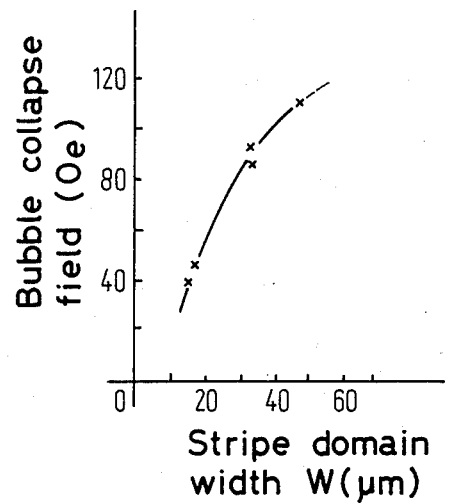
FIG. 7 is a graph showing the relationship between a bubble collapse field and a stripe domain width of the bubble element.

The magnetic field under which the bubble can exist stably depends upon the construction of the hard film and the width of the inversion domain and other factors. As one example, FIG. 7 shows the result of measurement on the bubble collapse field $H_{col}$ (Oe) in the case where the inversion domain width W (μm) was changed in the laminated layer comprising the same hard and soft films as the construction of the aforesaid embodiment.

What we claim is:

1. A laminated magnetic bubble device comprising at least one thin magnetic film having vertically oriented anisotropy and low coercive force and at least one thin magnetic film having vertically oriented anisotropy and high coercive force laminated with each other on a substrate, said thin film of high coercive force being magnetized to form a plurality of stable magnetic domains whose directions of magnetization are different from each other with their adjoining domains, said magnetic domains in said thin film of high coercive force being arranged in stripes, each stripe extending along a bubble transferring circuit pattern for defining bubble moving region to prevent the bubble from jumping out to another circuit pattern.

2. A laminated magnetic bubble device according to claim 1, wherein said thin film of high coercive force has a coercive force higher than a bias field to be applied.

3. A laminated magnetic bubble device according the claim 1, wherein the coercive force of said thin film of low coercive force is less than 10 Oe and the coercive force of said thin film of high coercive force is higher than 80 Oe.

4. A laminated magnetic bubble device according to claim 1, wherein the coercive force of said thin film of high coercive force is preferably in the range 100°–3000° Oe.

5. A laminated magentic bubble device according to claim 1, wherein said thin film of low coercive force is made of $(YBi)_3(FeGa)_5O_{12}$.

6. A laminated magnetic bubble device according to claim 1, wherein said thin film of high coercive force is made of $(BiGdSmLu)_3(FeAl)_5O_{12}$.

7. A laminated magnetic bubble device according to claim 1, wherein the thickness of each said thin film of high and low coercive force is less than approximately 100 μm and preferably in the range of approximately 0.01–10 μm.

8. A laminated magnetic bubble device according to claim 1, wherein a plurality of contiguous disc circuit pattern as said bubble transferring pattern is formed in the laminated film layer as minor loop circuit in a major/minor bubble transferring system and each contiguous disc circuit pattern is magnetically separated from each other with magnetic fields from magnetic domains formed in said thin film of high coercive force and arranged in stripes extending along contiguous direction of said disc circuit pattern.

9. A laminated magnetic bubble device according to claim 8, wherein said striped domains consist of first kind of domains and second kind of domains respectively magnetized in opposite vertical directions and alternately arranged, and each of said contiguous disc circuit pattern faces to said first kind of domain and separated from each other by said second kind of domain, so that the bubble can not jump from one contiguous disc circuit pattern to ajoining another pattern.

10. A laminated magnetic bubble device according to claim 9, wherein each of said contiguous disc circuit pattern is divided along the longitudinal direction thereof into three regions consisting of a central region and two regions on both sides of said central region, said central region facing to said second kind of domain and said two regions facing to said first kind of domain, so that the bubble cannot jump from one of said two regions to the other regions.

11. A laminated magnetic bubble device comprising a first thin magnetic film having vertically oriented anisotropy and low coercive force for carrying bubble domains and bubble transferring circuit patterns for moving bubble domains along the pattern, the improvement comprising a second thin magnetic film coupled magnetically with said first magnetic film and having vertically oriented anisotropy and high coercive force, said second magnetic film being divided into a plurality of stable magnetic domains each extending over an individual transferring circuit pattern for defining bubble moving region to prevent the bubble from jumping out to another adjoining circuit pattern.

12. A laminated magnetic bubble device according to claim 11, wherein said individual transferring circuit pattern is covered with said magnetic domain formed in said second film by magnetization in the same direction with said bubble and is separated from another adjoining circuit pattern by an intervening magnetic domain formed in said second film by magnetization in the opposite direction to said bubble.

13. A laminated magnetic bubble device according to claim 11, wherein said bubble transferring circuit patterns are contiguous disc circuit patterns respectively separated with each other by the fields from the domains of said second magnetic film, said domains being arranged in stripes extending along contiguous direction of said disc pattern.

14. A laminated magnetic bubble device comprising a bubble storage layer and a bubble suppression layer magnetically coupled with said bubble storage layer, said bubble suppression layer having vertically oriented anisotropy of high coercive force and magnetized to form alternate arrangement of first kind of domains and second kind of domains, each of said first kind of domains extending over a bubble transferring circuit and said second domains having magnetization in opposite direction with said first domain so as to prevent the bubble from jumping out to another adjoining circuit.

15. A laminated magnetic bubble device according to claim 14, wherein said first and second kind of domains are alternately arranged in stripes along the transferring circuit.

* * * * *